US012619274B2

(12) United States Patent　(10) Patent No.:　US 12,619,274 B2
Lee et al.　(45) Date of Patent:　May 5, 2026

(54) SEMICONDUCTOR DEVICE PERFORMING CLOCK GATING AND OPERATING METHOD THEREOF

(71) Applicant: SAMSUNG ELECTRONICS CO., LTD., Suwon-si (KR)

(72) Inventors: Jaeyoung Lee, Suwon-si (KR); Byungsu Kim, Suwon-si (KR); Youngsan Kim, Suwon-si (KR); Jaegon Lee, Suwon-si (KR); Jaehoon Kim, Suwon-si (KR); Byeongho Lee, Suwon-si (KR); Jongjin Lee, Suwon-si (KR); Wookyeong Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 41 days.

(21) Appl. No.: 18/609,073

(22) Filed: Mar. 19, 2024

(65) Prior Publication Data

US 2024/0319761 A1　Sep. 26, 2024

(30) Foreign Application Priority Data

Mar. 24, 2023　(KR) ......................... 10-2023-0039214

(51) Int. Cl.
*G06F 1/08*　(2006.01)
*H03K 5/133*　(2014.01)
*H01L 23/00*　(2006.01)
*H01L 23/498*　(2006.01)
(Continued)

(52) U.S. Cl.
CPC ............... *G06F 1/08* (2013.01); *H03K 5/133* (2013.01); *H01L 23/49816* (2013.01); *H01L*

*24/16* (2013.01); *H01L 25/105* (2013.01); *H01L 2224/16225* (2013.01); *H03K 5/1534* (2013.01)

(58) Field of Classification Search
None
See application file for complete search history.

(56) References Cited

U.S. PATENT DOCUMENTS

| 8,627,160 B2 | 1/2014 | Devta-Prasanna et al. |
| 9,164,563 B2 | 10/2015 | Berry, Jr. et al. |
| 9,369,119 B2 | 6/2016 | Drake et al. |
| (Continued) | | |

FOREIGN PATENT DOCUMENTS

| JP | 2009-081532 A2 | 4/2009 |

OTHER PUBLICATIONS

Extended European Search Report dated Aug. 7, 2024 in corresponding European Patent Application No. 24164929.2 (10 pages).

*Primary Examiner* — Cassandra F Cox
(74) *Attorney, Agent, or Firm* — Morgan, Lewis & Bockius LLP

(57) ABSTRACT

A semiconductor device includes an intellectual property (IP) block configured to operate based on a first clock signal and a power voltage, a clock gating circuit configured to operate based on the power voltage, and generate the first clock signal by selectively performing clock gating on a second clock signal based on an enable signal, and a critical path monitor (CPM) configured to generate a digital code having a value, which varies according to a voltage drop of the power voltage, and activate the enable signal based on a comparison of the value of the digital code with a reference value.

20 Claims, 14 Drawing Sheets

1

(51) Int. Cl.
   *H01L 25/10*        (2006.01)
   *H03K 5/1534*       (2006.01)

(56)                    References Cited

U.S. PATENT DOCUMENTS

| | | | | |
|---|---|---|---|---|
| 10,860,051 | B2 | 12/2020 | Kalyanam et al. | |
| 11,029,742 | B2 | 6/2021 | Webel et al. | |
| 2014/0028364 | A1 | 1/2014 | Venkatraman et al. | |
| 2016/0365860 | A1 | 12/2016 | Ma et al. | |
| 2017/0075404 | A1 | 3/2017 | Kitaji et al. | |
| 2022/0050493 | A1 | 2/2022 | Lee et al. | |
| 2022/0404890 | A1* | 12/2022 | Parashurama ........ | G06F 1/3296 |
| 2023/0195207 | A1* | 6/2023 | Kim ..................... | G06F 1/3296 |
| | | | | 700/300 |

* cited by examiner

SEMICONDUCTOR DEVICE PERFORMING CLOCK GATING AND OPERATING METHOD THEREOF

CROSS-REFERENCE TO RELATED APPLICATION

This application is based on and claims priority under 35 U.S.C. § 119 to Korean Patent Application No. 10-2023-0039214, filed on Mar. 24, 2023 in the Korean Intellectual Property office, the disclosure of which is incorporated by reference herein in its entirety.

TECHNICAL FIELD

This disclosure relates generally to semiconductor devices and more particularly to a semiconductor device performing clock gating to compensate for a voltage drop, and an operating method of the semiconductor device.

DISCUSSION OF RELATED ART

As the integration degree and complexity of semiconductor devices increase and the operating speed increases, the issue of low power consumption becomes a paramount factor. When power consumption is high, the temperature of a chip may increase, which causes the chip to operate slowly or even become inoperable. Moreover, the package may be damaged or its lifetime reduced.

In semiconductor circuits within the semiconductor devices, circuits which provide or block clocks for power reduction are sometimes incorporated. A clock gating circuit may function to suspend clocks to a particular circuit and thereby control an overall frequency of an operation of the particular circuit.

SUMMARY

Embodiments of the inventive concept provide a semiconductor device, which monitors the operation speed of a circuit generated by a voltage drop at a fast response time and compensates for the voltage drop by performing clock gating for a clock signal, and an operating method of the semiconductor device.

According to an aspect of the inventive concept, there is provided a semiconductor device including an intellectual property (IP) block configured to operate based on a first clock signal and a power voltage, a clock gating circuit configured to generate the first clock signal by selectively performing clock gating on a second clock signal based on an enable signal, and a critical path monitor (CPM) configured to operate based on the power voltage, generate a digital code having a value, which varies according to a voltage drop of the power voltage, and to activate the enable signal based on a comparison of the value of the digital code with a reference value.

According to another aspect of the inventive concept, there is provided an operating method of a semiconductor device including generating a first sample waveform and a second sample waveform having an inverted phase with respect to the first sample waveform by sampling an input waveform based on a first clock signal, generating a first waveform based on a comparison result between the first sample waveform and a first delay waveform generated by delaying the first sample waveform using a first delay circuit operating based on a power voltage, and the first sample waveform, generating a second waveform based on a comparison result between the second sample waveform and a second delay waveform generated by delaying the second sample waveform using a second delay circuit operating based on the power voltage, and the second sample waveform, generating an enable signal by comparing a value of a digital code, in which the first waveform and the second waveform are merged, with a reference value, and performing a clock gating on the first clock signal based on the enable signal.

According to another aspect of the inventive concept, there is provided a semiconductor device including a processor, a clock generator configured to generate a first clock signal, a clock gating circuit configured to generate a second clock signal provided to the processor by performing clock gating on the first clock signal based on an enable signal, and a CPM configured to operate based on a power voltage, and adjust a deactivation time of the enable signal based on a magnitude of the power voltage.

According to another aspect of the inventive concept, there is provided a semiconductor device including: a processor; a clock generator configured to generate a first clock signal; a clock gating circuit configured to generate a second clock signal provided to the processor by performing a clock gating on the first clock signal based on an enable signal; and a CPM configured to monitor a critical path of the processor based on a power voltage, and to initiate a deactivation period of the enable signal using a binary code generated based on a magnitude of the power voltage.

BRIEF DESCRIPTION OF THE DRAWINGS

Embodiments will be more clearly understood from the following detailed description taken in conjunction with the accompanying drawings in which:

FIG. 7 is a timing diagram of an operation of a semiconductor device, according to an embodiment;

FIG. 8 is a timing diagram of an operation of a semiconductor device, according to an embodiment;

FIG. 12 is a circuit diagram of an example edge detector in FIG. 4;

DETAILED DESCRIPTION OF EMBODIMENTS

Hereinafter, various embodiments of the inventive concept are described in conjunction with the accompanying drawings.

Herein, the terms "waveform" and "pattern" may be used interchangeably.

Herein, an element (e.g., a component, signal, etc.) may be referred to by just its label following an initial introduction of the element and label (e.g., "input clock signal CLK_N" may be subsequently referred to as just "CLK_N").

Figure 1:
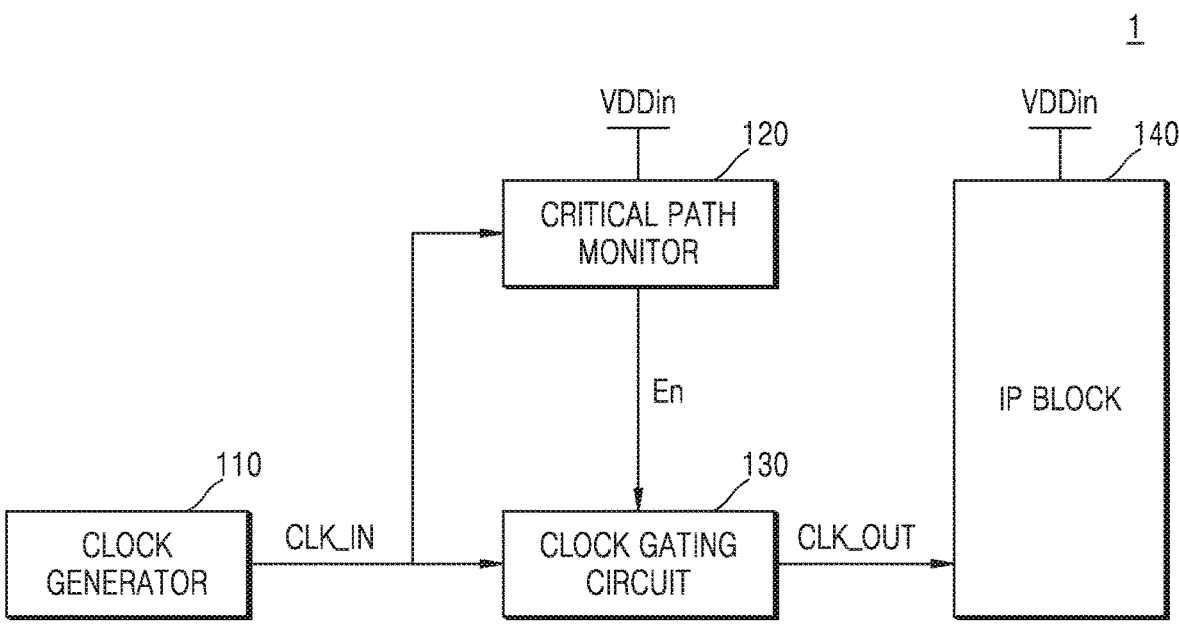
FIG. 1 is a block diagram of a semiconductor device according to an embodiment.

FIG. 1 is a block diagram of a semiconductor device 1 according to an embodiment.

Referring to FIG. 1, the semiconductor device 1 may include a clock generator 110, a critical path monitor (CPM) 120, a clock gating circuit 130, and an intellectual property (IP) block 140. In some embodiments, the semiconductor device 1 may be implemented as a system on chip (SoC). The SoC may include a system bus, to which a protocol with a certain standard bus specification is applied. Components included in the semiconductor device 1 may be connected to the system bus. For example, as a standard specification for the system bus, an advanced microcontroller bus architecture (AMBA) protocol of advanced reduced instruction set computer (RISC) machine (ARM) may be applied. Bus types of the AMBA protocol may include an advanced high-performance bus (AHB), an advanced peripheral bus (APB), an advanced extensible interface (AXI), AXI4, AXI coherency extensions (ACE), etc. In addition, another protocol type, such asuNetwork of SONICs Inc., CoreConnect of IBM, Inc., and open core protocol of open core protocol (OCP)-IP, may be applicable.

The clock generator 110 may generate an input clock signal CLK_IN based on an input power voltage VDDin. The clock generator 110 may include an oscillator, a phase lock loop (PLL) circuit, or a delayed lock loop (DLL) circuit.

The CPM 120 may effectively monitor a critical path delay within the IP block 140 by monitoring the input power voltage VDDin. Further, the CPM 120 may initiate pauses in the clock signal provided to the IP block 140 when the delay of the critical path is excessive (as dynamically determined by an amount of voltage drop in VDDin). To this end, the CPM 120 may monitor the input clock signal CLK_IN, and generate an enable signal En provided to the clock gating circuit 130. The CPM 120 may generate the enable signal En based on the input power voltage VDDin. The CPM 120 may control an output clock signal CLK_OUT to not oscillate between low and high logic levels) by deactivating the enable signal En when a delay of the internal signal is prolonged and excessive due to the voltage drop of the input power voltage VDDin. The enable signal En may be deactivated when the enable signal En is at a low level and activated when the enable signal EN is at a high level, or vice versa (the former example is discussed hereafter for simplicity).

The clock gating circuit 130 may generate the output clock signal CLK_OUT by performing a clock gating operation on the input clock signal CLK_IN based on the enable signal En. When the enable signal En is activated, the output clock signal CLK_OUT may oscillate, and when the enable signal En is deactivated, the output clock signal CLK_OUT may not oscillate (a constant voltage level is output). An example of the clock gating circuit 130 is described in detail with reference to FIG. 6.

Herein, an "IP block" may be a reusable unit of logic layout design, cell layout design or IC layout design. In some embodiments, an IP block is not the intellectual property of any party. In other embodiments, an IP block is the intellectual property of one or more parties.

The IP block 140 may be connected to the system bus, and may operate based on the output clock signal CLK_OUT. The IP block 140 may process at least one command. For example, the IP block 140 may be or include a processor, a graphics processor, a memory controller, an input and output interface block, or the like. The IP block 140 may be composed of or include processors having different computational throughput, such as a single core and a multi core.

The CPM 120 and the IP block 140 may receive the same input power voltage VDDin. The input power voltage VDDin may be provided from outside the semiconductor device 1. As the number of commands processed by the IP block 140 increases, the power consumed by the IP block 140 may increase. This may cause a voltage drop at the level of the input power voltage VDDin initially provided to the CPM 120, resulting in a circuit delay increase in the CPM 120. Accordingly, a value of a digital code (e.g., binary code) indicating the circuit delay may increase or decrease (depending on a predetermined correlation of the digital code with VDDin and the circuit delay). Examples of the digital code are described below in detail with reference to FIGS. 7 and 12.

The configuration and operations of the CPM 120 may allow for a faster response time for initiating a pause in the clock signal supplied to the IP block 140 when power voltage VDDin is reduced, as compared to conventional techniques. To this end, the CPM 120 may generate the digital code according to the circuit delay, and activate the enable signal En based on a comparison of the digital code with a reference value. The clock gating circuit 130 may suspend oscillations of the output clock signal CLK_OUT provided to the IP block 140, by performing the clock gating operation on the input clock signal CLK_IN based on the enable signal En. As an overall operating frequency decreases due to the suspended oscillations of the output clock signal CLK_OUT), malfunctions occurring due to a voltage drop in the IP block 140 may be prevented until the voltage level is recovered. (Note that CLK_OUT may have the same oscillation frequency as CLK_IN when oscillations resume, but when considering the time periods in which CLK_OUT is suspended, the overall clock operating frequency may be reduced.)

Because the CPM 120 generating the enable signal En, and the clock gating circuit 130 performing the clock gating use the same clock signal, a synchronization operation between different clocks may not be required, and accordingly, the fast clock gating may be performed.

Because the clock gating circuit 130 and the CPM 120 monitoring the voltage drop use the same clock signal, the clock gating circuit 130 and the CPM 120 may respond quickly to the voltage drop.

Figure 2:
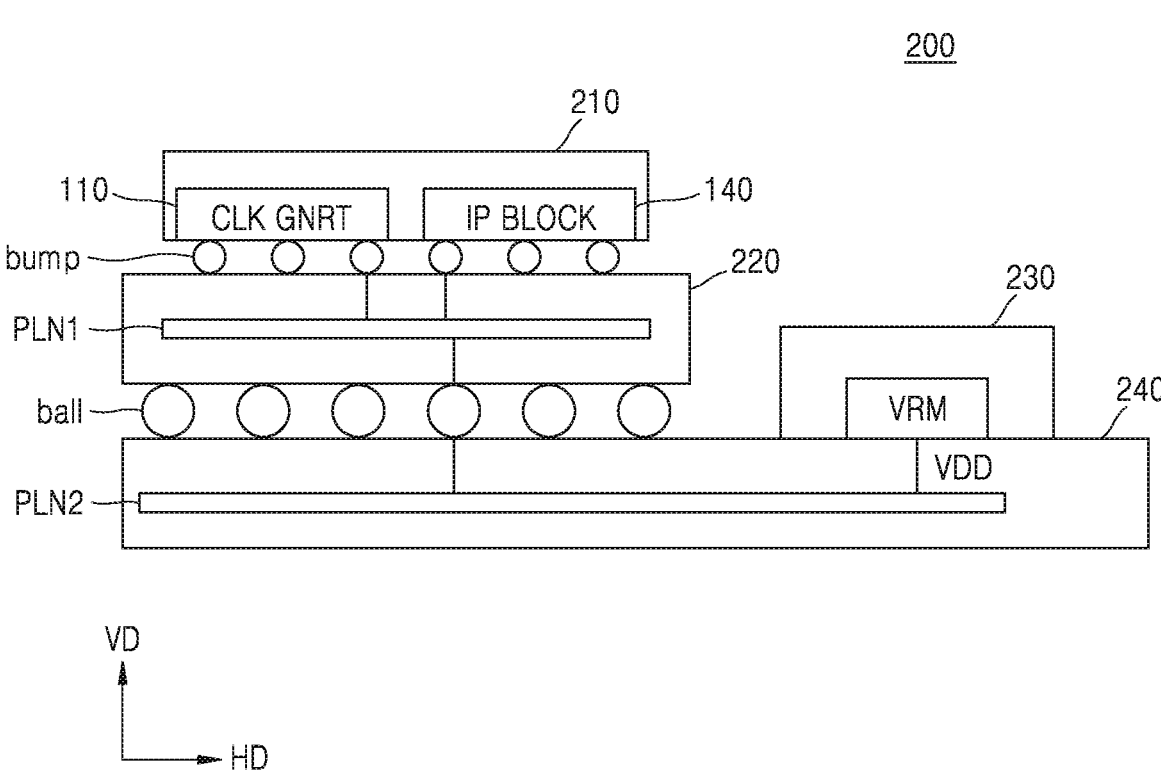
FIG. 2 is a diagram of a semiconductor system according to an embodiment.

FIG. 2 is a diagram of a semiconductor system 200 according to an embodiment. The semiconductor system 200 may include a processor chip 210, a package substrate 220, a power management integrated circuit (PMIC) 230 and a circuit board 240.

The circuit board 240 may extend in a horizontal direction HD, and the package substrate may be connected to the PMIC 230 in a vertical direction VD. The package substrate 220 may be connected to the circuit board 240 via a ball. The package substrate 220 may be connected to the processor chip 210 via a bump. The processor chip 210 may the semiconductor device 1 of FIG. 1 (only the clock generator 110 and IP block 140 are shown within the processor chip 210 in FIG. 2).

The PMIC 230 may include a voltage regulator module VRM, which generates a power voltage VDD. The power voltage VDD may be provided to a second power plane PLN2 of the circuit board 240.

The power voltage VDD may be transferred from the circuit board 240 to the package substrate 220 via the ball. The power voltage VDD may be provided to a first power plane PLN1 in the package substrate 220.

The power voltage VDD provided to the first power plane PLN1 may be provided to the processor chip 210 via the bump as the input power voltage VDDin. The input power voltage VDDin may be provided to a clock generator CLK GNRT 110 and the IP BLOCK 140 in the processor chip 210.

As the number of commands processed by the IP BLOCK increases, the voltage drop may worsen, and due to the voltage drop, without the clock delay compensation as taught here, the input power voltage VDDin may become lower than the voltage required for acceptable operation of the IP BLOCK.

Figure 3:
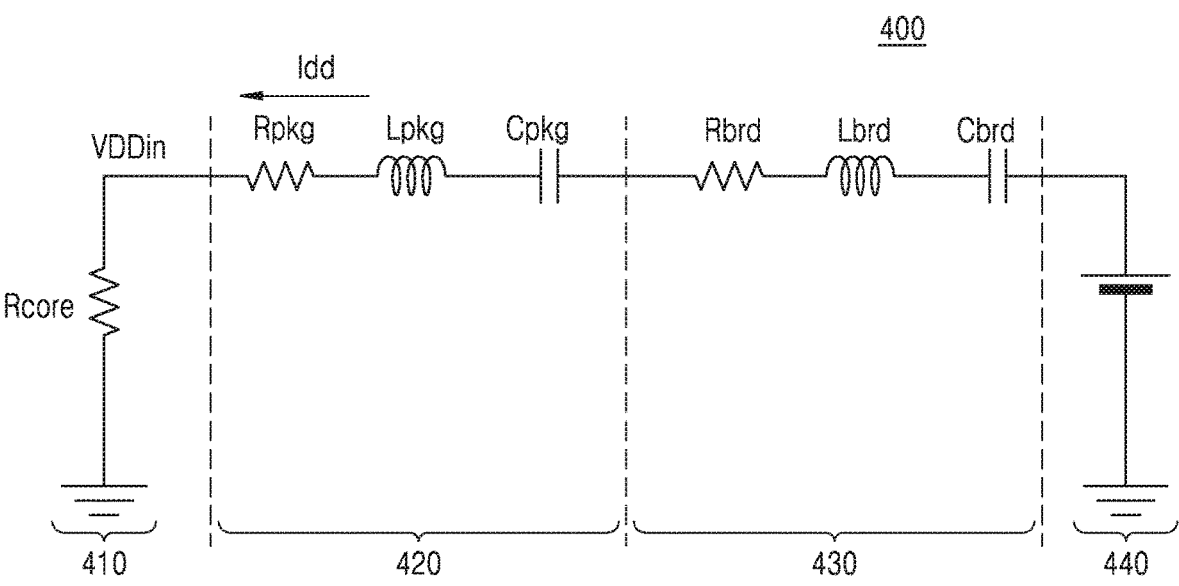
FIG. 3 is a circuit diagram of a power delivery network according to an embodiment.

FIG. 3 is a circuit diagram of a power delivery network 400 according to an embodiment. The power delivery network 400 may present a path through which the voltage generated by a PMIC 440 is transmitted to a processor chip 410 via a circuit board 430 and a package substrate 420.

The PMIC 440 may be understood as a voltage source generating the power voltage VDD. The circuit board 430 may be understood as an equivalent circuit including at least one of an inductor Lbrd, a capacitor Cbrd, and a resistor Rbrd. The package substrate 420 may be understood as an equivalent circuit including at least one of an inductor Lpkg, a capacitor Cpkg, and a resistor Rpkg. The processor chip 410 may be understood as an equivalent circuit including a resistor Rcore.

As the throughput of the processor chip 410 increases, a current Idd may increase rapidly. A high voltage (e.g., a voltage spike) may be induced in the inductor Lpkg due to the rapidly increasing current Idd. Accordingly, the magnitude of the input power voltage VDDin provided to the processor chip 410 may decrease. In other words, the PMIC 440 may output a relatively high power voltage VDD to compensate for variability of the input power voltage VDD due to the voltage drop. In this case, there may be a risk that power consumed by the power delivery network 400 is unnecessarily wasted.

Figure 4:
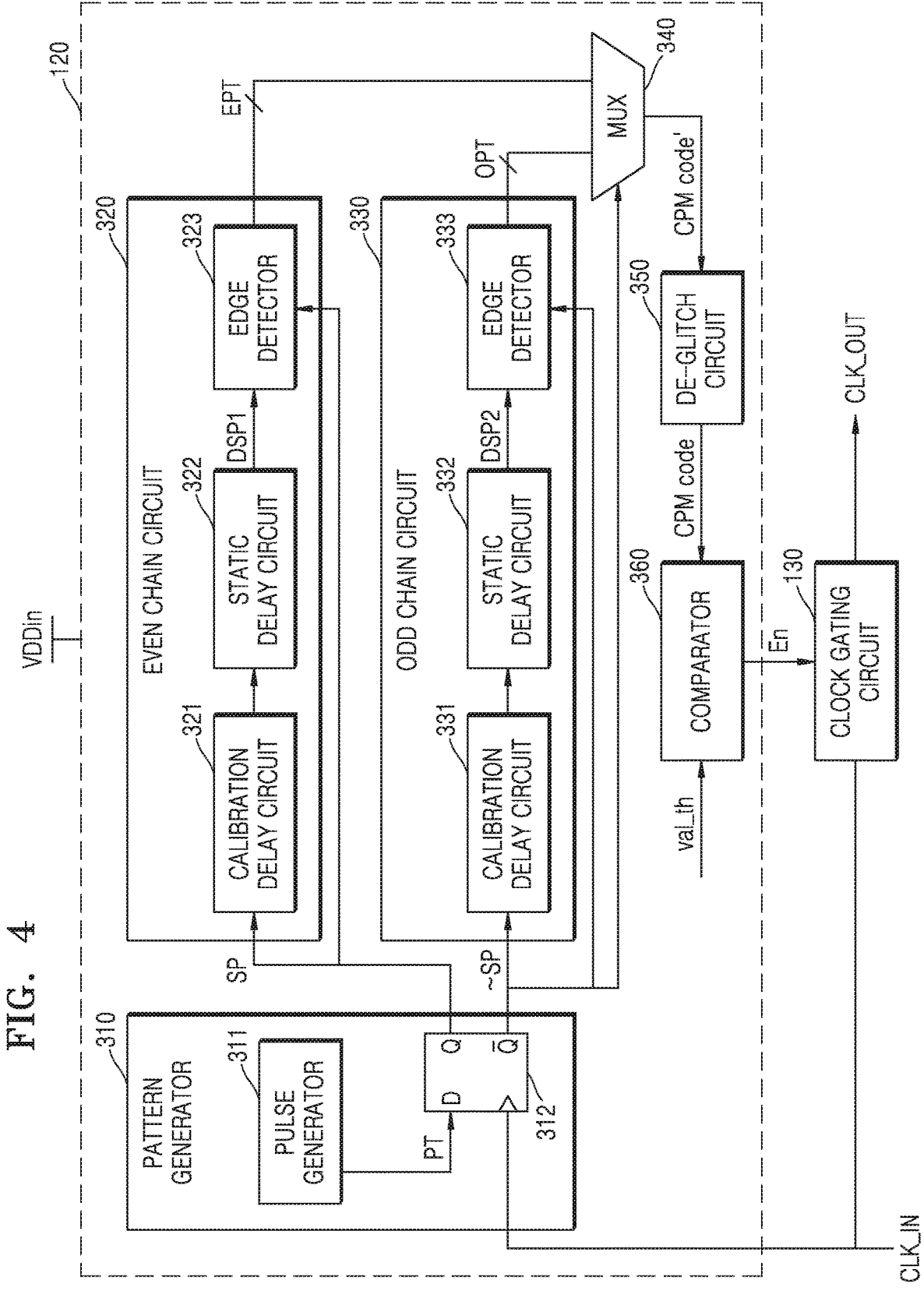
FIG. 4 is a block diagram of a critical path monitor (CPM) and a clock gating circuit according to an embodiment.

FIG. 4 is a block diagram of the CPM 120 and the clock gating circuit according to an embodiment.

Referring to FIG. 4, the CPM 120 may include a pattern (interchangeably herein, "waveform") generator 310, an "even chain" circuit 320, an "odd chain" circuit 330, a selection circuit 340, a de-glitch circuit 350, and a comparator 360. The components included in the CPM 120 may operate based on the input power voltage VDDin.

Figure 7:
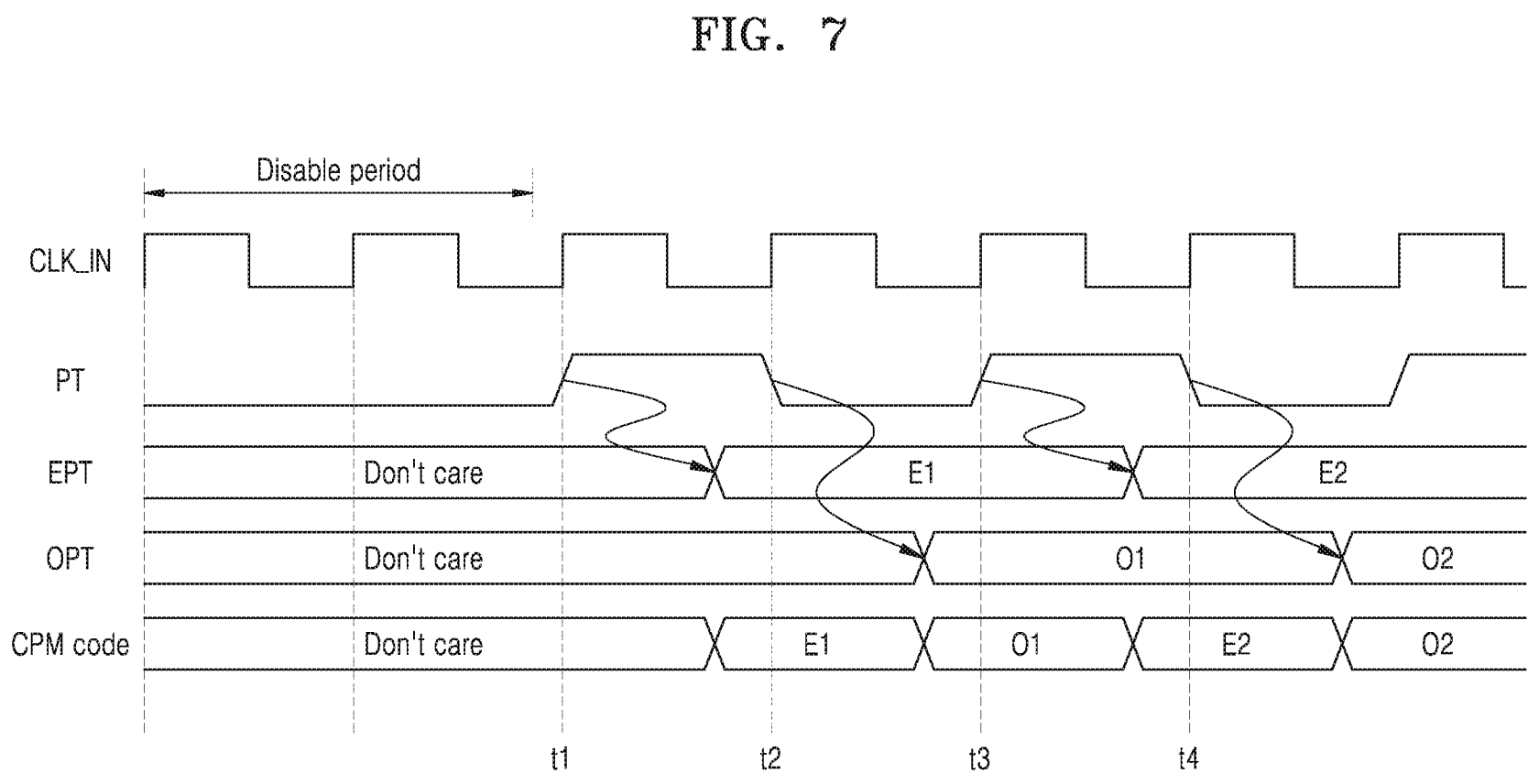
Figure 13:
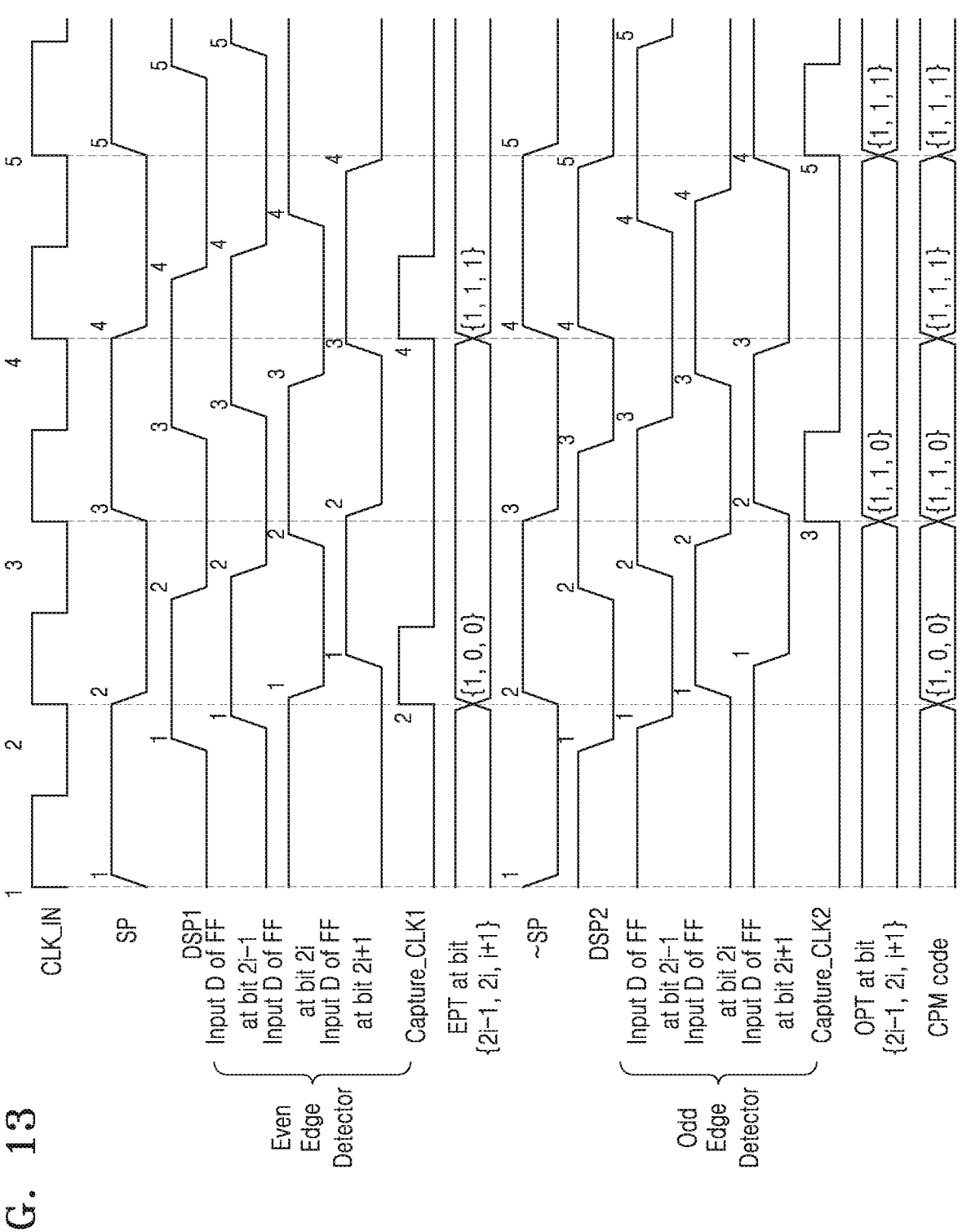
FIG. 13 is a timing diagram describing an example method of generating the CPM code.

The pattern generator 310 may include a pulse generator 311 and a flip-flop 312. The pulse generator 311 may generate a periodic input pattern PT (e.g., a pulsed waveform ("pulse train") as illustrated in FIG. 7) having a frequency less than a frequency of CLK_IN. PT may be a clock signal waveform having a frequency one half that of CLK_IN. The flip-flop 312 may generate a sample pattern SP (e.g., a pulsed waveform ("pulse train") as illustrated in FIG. 13, generated by sampling) and an inverted sample pattern ~SP by sampling the input pattern PT based on the input clock signal CLK_IN. The inverted sample pattern ~SP may have a phase opposite to that of the sample pattern SP. A period of the sample pattern SP may be twice a period of the input clock signal CLK_IN.

The even chain circuit 320 may generate an even pattern EPT (e.g., as shown in FIG. 7) based on the sample pattern SP. The even pattern EPT may be calculated based on a pattern PT that is sampled at an even-numbered edge of the input clock signal CLK_IN. The even pattern EPT may indicate the circuit delay according to a voltage drop of the input power voltage VDDin.

The odd chain circuit 330 may generate an odd pattern OPT (see, e.g., FIG. 7) based on the inverted sample pattern ~SP. The odd pattern OPT may be calculated based on the pattern PT sampled at the odd-numbered edge of the input clock signal CLK_IN. The odd pattern OPT may indicate the circuit delay according to the voltage drop of the input power voltage VDDin. Herein, an even-numbered edge may be an edge adjacent to an odd-numbered edge. In a pulse train such as a clock signal, an even-numbered edge is a rising edge and an odd-numbered edge is a falling edge, or vice versa. Herein, each of the even chain circuit 320 and the odd chain circuit 330 may be referred to as a pattern (waveform) generation circuit.

The even chain circuit 320 may include a calibration delay circuit 321, a static ("fixed") delay circuit 322, and an edge detector 323.

The calibration delay circuit 321 may adjust a delay of the sample pattern SP. The calibration delay circuit 321 may perform a calibration operation on the value of the even pattern EPT by adjusting the amount of delay. The fixed delay circuit 322 may generate a first delay sample pattern DSP1, by adding a fixed amount of delay to the output of the calibration delay circuit 321.

By comparing the first delay sample pattern DSP1 with the sample pattern SP, the edge detector 323 may update the even pattern EPT representing the delay amount of the input clock signal CLK_IN at each even-numbered edge of the input clock signal CLK_IN. Detailed operations of the edge detector 323 may be described below with reference to FIGS. 12 and 13. In other words, a delay may be generated as the input pattern PT passes through the flip-flop 312, the calibration delay circuit 321, and the fixed delay circuit 322, and the amount of the delay generated may be detected by the edge detector 323. Accordingly, the even pattern EPT may indicate the circuit delay caused by the voltage drop of the input power voltage VDDin.

The odd chain circuit 330 may include a calibration delay circuit 331, a static delay circuit 332, and an edge detector 333.

The calibration delay circuit 331 may adjust the delay of the inverted sample pattern ~SP. The calibration delay circuit 331 may perform a calibration operation on the value of the odd pattern OPT by adjusting the amount of delay. The static delay circuit 332 may generate a second delay sample pattern DSP2, by adding a fixed amount of delay to the output of the calibration delay circuit 331.

By comparing the second delay sample pattern DSP2 with the inverted sample pattern ~SP, the edge detector 333 may update the odd pattern OPT indicating the delay amount of the input clock signal CLK_IN at each odd-numbered edge of the input clock signal CLK_IN. Detailed operation of the edge detector 333 may be described below with reference to FIGS. 12 and 13. In other words, a delay may be generated as the input pattern PT passes through the flip-flop 312, the calibration delay circuit 331, and the static delay circuit 332, and the amount of the delay generated may be detected by the edge detector 333. Accordingly, the odd pattern OPT may indicate the circuit delay caused by a voltage drop of the input power voltage VDDin.

The selection circuit 340 may generate a CPM code CPM code' before correction, by selectively outputting the even pattern EPT or the odd pattern OPT based on the inverted sample pattern ~SP. For example, the selection circuit 340 may output the even pattern EPT when the inverted sample pattern ~SP is at a high level, and may output the odd pattern OPT when the inverted sample pattern ~SP is at a low level. However, the embodiment is not limited thereto, and the selection circuit 340 may also selectively output the even pattern EPT or the odd pattern OPT based on the sample pattern SP.

The de-glitch circuit 350 may generate CPM code by removing the glitch from CPM code' before correction.

The comparator 360 may compare the value of CPM code with a reference value val_th, and activate the enable signal En according to the comparison result. In some embodiments, the comparator 360 may deactivate the enable signal En during a reference time when the value of CPM code is less than or equal to the reference value val_th. In some embodiments, the comparator 360 may deactivate the enable signal En when the value of CPM code is less than a first reference value, and may activate the enable signal En when the value of CPM code is greater than a second reference value.

The clock gating circuit 130 may receive the input clock signal CLK_IN, and control the output clock signal CLK_OUT not to oscillate during a deactivation period of the enable signal En.

Figure 5:
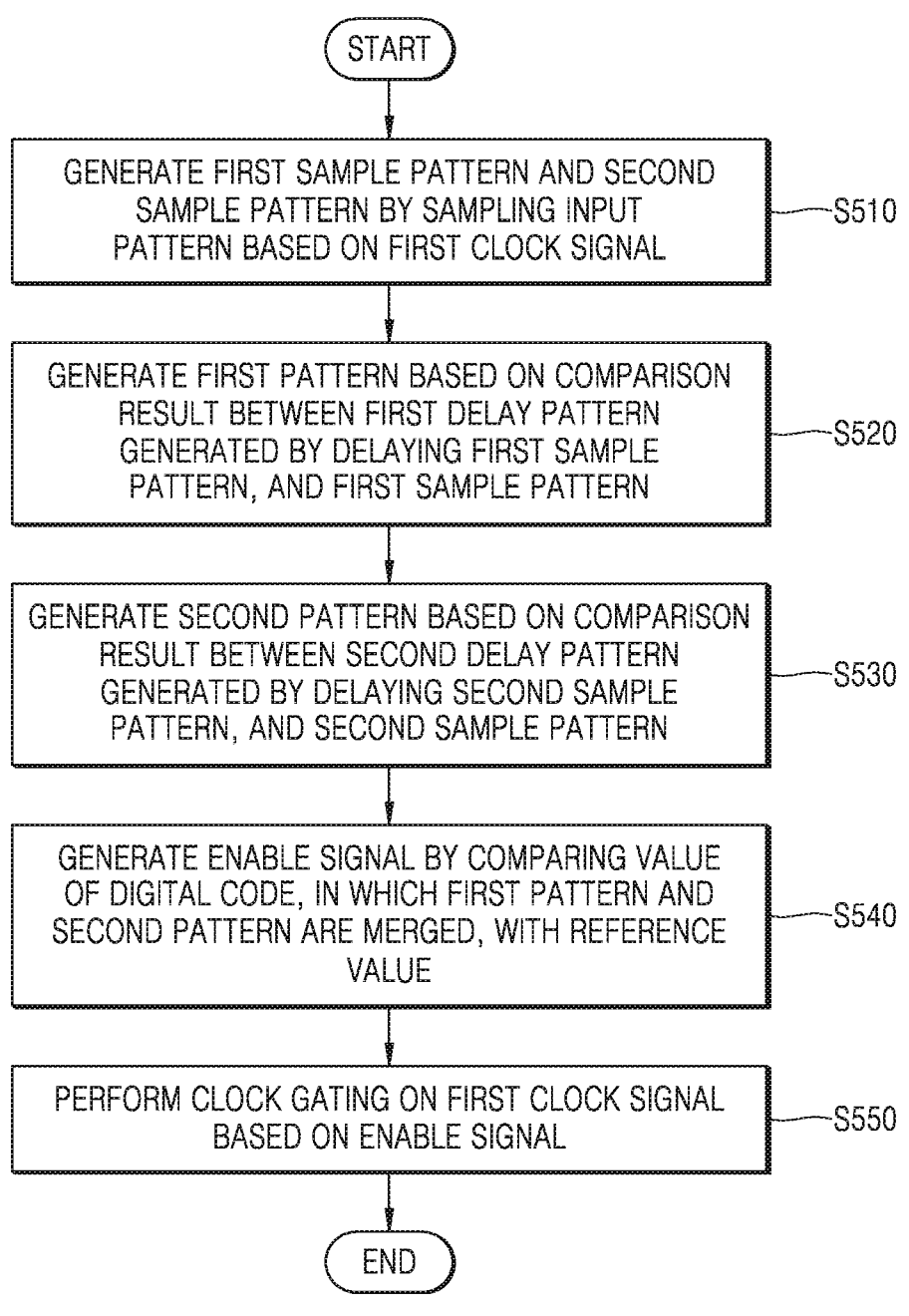
FIG. 5 is a flowchart of an operating method of a semiconductor device, according to an embodiment.

FIG. 5 is a flowchart of an operating method of a semiconductor device, according to an embodiment. FIG. 5 is described below with reference to FIG. 4.

Referring to FIG. 5, the CPM 120 may generate a first sample pattern (for example, SP) and a second sample pattern (for example, ~SP) by sampling the input pattern PT based on a first clock signal (for example, CLK_IN) (S510).

The CPM 120 may compare a first delay pattern (for example, DSP1) generated by delaying the first sample pattern with the first sample pattern, and generate a first pattern (for example, EPT) based on the comparison result (S520).

The CPM 120 may compare a second delay pattern (for example, DSP2) generated by delaying a second sample pattern with the second sample pattern, and generate a second pattern (for example, OPT) based on the comparison result (S530).

The CPM 120 may generate an enable signal (for example, En) by comparing a value of a digital code (for example, CPM code), in which the first pattern and the second pattern are merged, with a reference value (S540).

The CPM 120 may generate a second clock signal (for example, CLK_OUT) by performing the clock gating operation on a first clock signal based on an enable signal (S550).

Figure 6:
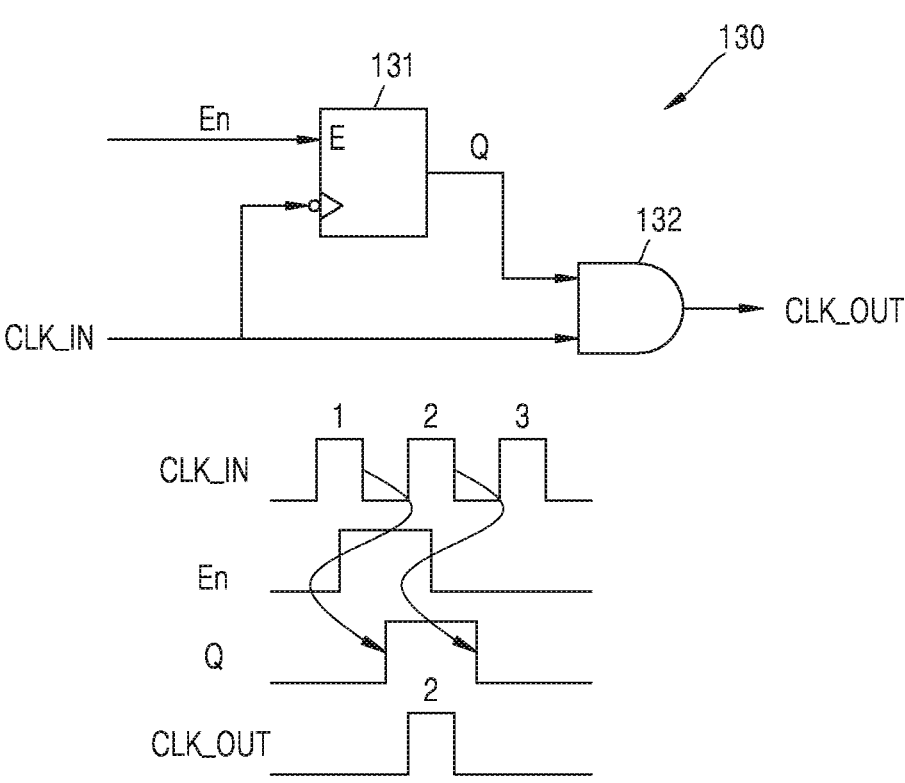
FIG. 6 is a circuit diagram of a clock gating circuit according to an embodiment.

FIG. 6 is a circuit diagram of a clock gating circuit 130 according to an embodiment.

Referring to FIG. 6, the clock gating circuit 130 may include a latch circuit 131 and an AND circuit 132.

The latch circuit 131 may latch the enable signal En in synchronization with the falling edge of the input clock signal CLK_IN. A latched value may be output as an output signal Q. The AND circuit 132 may generate the output clock signal CLK_OUT by performing an AND operation on the output signal Q and the input clock signal CLK_IN.

For example, at the falling edge of a first cycle of first through third cycles of the input clock signal CLK_IN, the output signal Q may be transitioned to a high level by latching the enable signal En at a high level. At the falling edge of the second cycle, the enable signal En at a low level may be latched, and accordingly, the output signal Q may be transitioned to a low level.

As an AND operation is performed on the output signal Q and the input clock signal CLK_IN, the output clock signal CLK_OUT may include only the second cycle of the first through third cycles of the input clock signal CLK_IN.

In other words, when the enable signal EN is at a high level at a falling edge of the input clock signal CLK_IN, a next cycle of the input clock signal CLK_IN may be reflected in the output clock signal CLK_OUT, and when the enable signal EN is at a low level at a falling edge of the input clock signal CLK_IN, the next cycle of the input clock signal CLK_IN may not be reflected in the output clock signal CLK_OUT.

FIG. 7 is a timing diagram of an operation of a semiconductor device, according to an embodiment. FIG. 7 is described below with reference to FIGS. 1 through 4.

The input clock signal CLK_IN may oscillate, and when the magnitude of the input power voltage VDDin increases, the amount of the circuit delay representing the even pattern EPT and the odd pattern OPT may decrease. When the magnitude of the input power voltage VDDin decreases, the amount of the circuit delay representing the even pattern EPT and the odd pattern OPT may increase.

During a disable period, the pulse generator 311 may not generate the input pattern PT.

At a first time point t1, the flip-flop 312 may generate the sample pattern SP by sampling and latching the input pattern PT, and the even chain circuit 320 may generate the even pattern EPT by delaying the sample pattern SP. At a third time point t3, the flip-flop 312 may generate the sample pattern SP by sampling the input pattern PT, and the even chain circuit 320 may generate the even pattern EPT by delaying the sample pattern SP. The even chain circuit 320 may generate the even pattern EPT having a value E1 based on the input pattern PT sampled at the first time point t1, and an even pattern EPT having a value E2 value based on the input pattern PT sampled at the third time point t3. (It is noted here that EPT, OPT and CPM code are exemplified in FIG. 7 as differential signals whereas other signals are exemplified as single ended signals. In other examples, EPT, OPT and/or CPM code are single ended signals and/or the other signals are differential or single ended signals.)

At a second time point t2, the flip-flop 312 may generate the inverted sample pattern ~SP by sampling the input pattern PT, and the odd chain circuit 330 may generate the odd pattern OPT by delaying the inverted sample pattern ~SP. At a fourth time point t4, the flip-flop 312 may generate the inverted sample pattern ~SP by sampling the input pattern PT, and the odd chain circuit 330 may generate the odd pattern OPT by delaying the inverted sample pattern ~SP. The odd chain circuit 330 may generate the odd pattern OPT having a value O1 based on the input pattern PT sampled at the second time point t2, and an odd pattern OPT having a value O2 based on the input pattern PT sampled at the fourth time point t4.

The selection circuit 340 may alternately output the even pattern EPT and the odd pattern OPT to generate a CPM code.

Figure 8:
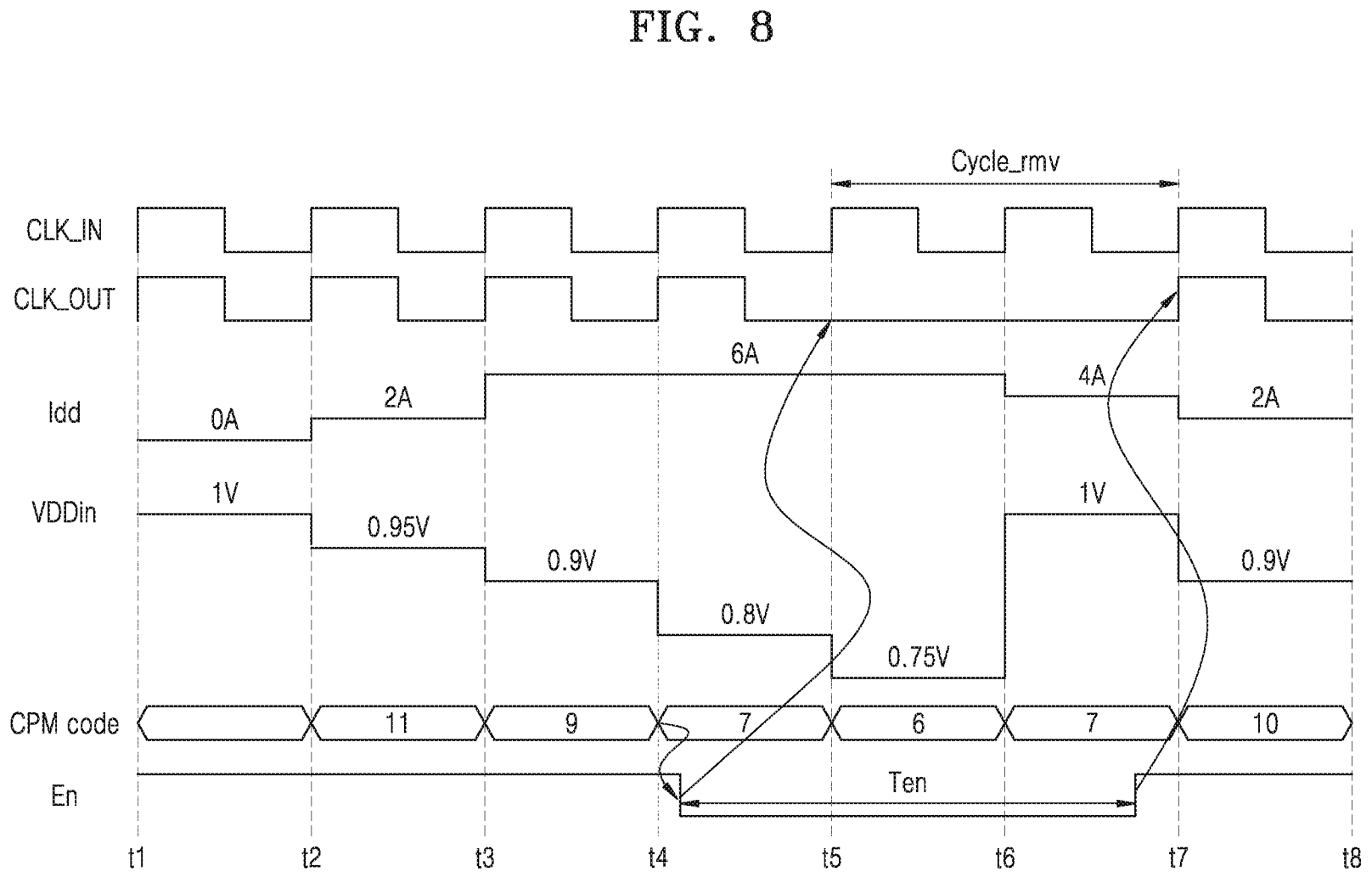

FIG. 8 is a timing diagram of an operation of a semiconductor device, according to an embodiment. FIG. 8 may be described with reference to FIGS. 1 through 4.

Referring to FIG. 8, the input clock signal CLK_IN may oscillate during first through eighth time points t1 through t8.

The magnitude of the current Idd between the first and second time points t1 and t2 may be 0 A, and the input power voltage VDDin may be 1 V.

As the throughput of the IP block 140 increases between the second and third time points t2 and t3, the magnitude of the current Idd may increase to 2 A, and accordingly, the magnitude of the input power voltage VDDin may decrease to 0.95 V. The value of the CPM code between the second and third time points t2 and t3 may be 11.

As the throughput of the IP block 140 increases between the third and fourth time points t3 and t4, the magnitude of the current Idd may increase to 6 A, and accordingly, the magnitude of the input power voltage VDDin may decrease to 0.9 V. The value of the CPM code between the third and fourth time points t3 and t4 may be 9. In other words, as the voltage drop of the input power voltage VDDin applied to the CPM 120 increases, the value of the CPM code may decrease.

In some embodiments, the comparator 360 may compare the value of the CPM code with the reference value val_th of 10. Since the value of the CPM code is less than the reference value val_th between the third and fourth time points t3 and t4, the comparator 360 may deactivate the enable signal En. The enable signal En may be deactivated during a reference time Ten. As the enable signal En is deactivated, the output clock signal CLK_OUT may not oscillate from the next cycle. Because the output clock signal CLK_OUT does not oscillate, the IP block 140 may be deactivated, and the magnitude of the current Idd may be reduced. In FIG. 8, although it is illustrated that the magnitude of the current Idd decreases from the sixth time point t6, the embodiment is not limited thereto. In FIG. 8, it is illustrated that the enable signal En is deactivated during the reference time Ten (a duration between two and three clock cycles of CLK_IN, but this is merely an example. The duration of Ten, as well as the other example values in FIG. 8, may vary from embodiment to embodiment according to the particular design of the IP block, among other factors. For instance, in some embodiments, the enable signal En may be activated when the value of the CPM code rises higher than another reference value (e.g., 6).

The magnitude of the current Idd may be maintained at 6 A between the fourth and fifth time points t4 and t5, and the magnitude of the input power voltage VDDin may be reduced to 0.8 V. The value of the CPM code may be 7 during the fourth and fifth time points t4 and t5. In other words, as the voltage drop of the input power voltage VDDin applied to the CPM 120 increases, the value of the CPM code may decrease.

The magnitude of the current Idd may be maintained at 6 A between the fifth and sixth time points t5 and t6, and the magnitude of the input power voltage VDDin may be reduced to 0.75 V. The value of the CPM code between the fifth and sixth time points t5 and t6 may be 6. In other words, as the voltage drop of the input power voltage VDDin applied to the CPM 120 increases, the value of the CPM code may decrease.

Between the sixth and seventh time points t6 and t7, the magnitude of the current Idd may be reduced to 4 A, and the magnitude of the input power voltage VDDin may be increased to 1 V. In other words, because as the output clock signal CLK_OUT does not oscillate, the throughput of the IP block 140 is reduced, and the current Idd is reduced, the input power voltage VDDin may increase. The value of the CPM code between the sixth and seventh time points t6 and t7 may be 7. On the other hand, after the reference time Ten between the sixth and seventh time points t6 and t7 elapses, the enable signal En may be activated. As the enable signal En is activated, the output clock signal CLK_OUT may oscillate from the next cycle.

Between the seventh and eighth time points t7 and t8, the magnitude of the current Idd may be reduced to 2 A, and the magnitude of the input power voltage VDDin may be reduced to 0.9 V. The value of the CPM code may be 7 between the seventh and eighth time points t7 and t8.

The clock gating circuit 130 may generate the output clock signal CLK_OUT by deactivating the input clock signal CLK_IN by a number of reference cycles Cycle_rmv of the input clock signal CLK_IN. The reference cycle Cycle_rmv may mean at least one cycle from a cycle following a cycle including a time point, at which the enable signal En is deactivated, to a cycle following a cycle including a time point, at which the enable signal En is activated.

In FIG. 8, the value of the CPM code is illustrated as decreasing when the circuit delay increases, but in other examples, as the circuit delay increases, the value of the CPM code may also increase.

Figure 9:
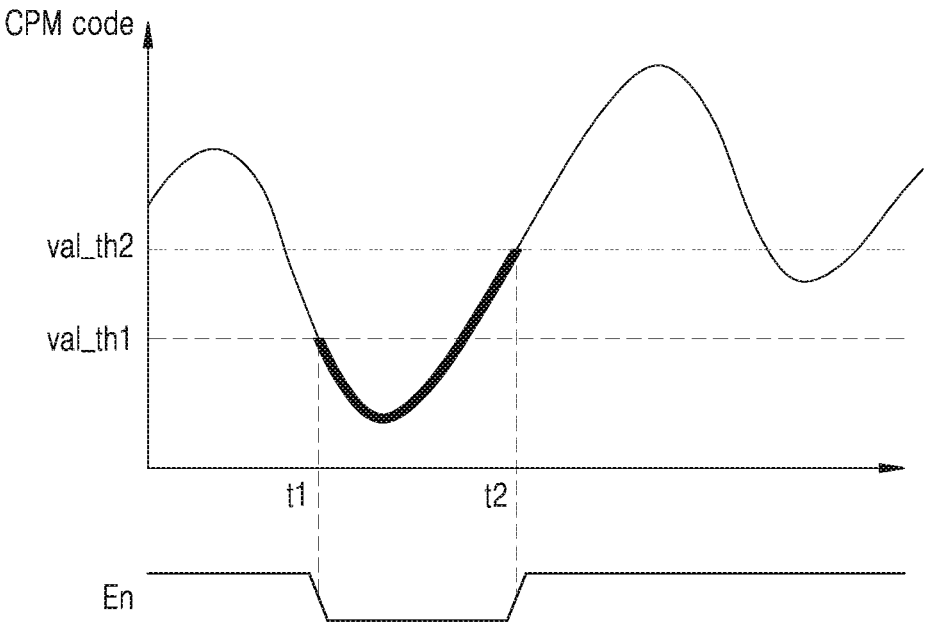
FIG. 9 is a diagram of a CPM code and reference values, according to an embodiment.

FIG. 9 is a diagram of example CPM codes and reference values, according to an embodiment.

Referring to FIG. 9, the value of the CPM code may vary as time elapses. For example, when an instantaneous rate of change of the current Idd increases according to the throughput of the IP block 140, the magnitude of the input power voltage VDDin may decrease, and the circuit delay may increase. Accordingly, the value of the CPM code indicating the circuit delay may decrease. In the opposite situation, the value of the CPM code may increase.

Referring to FIG. 9, when the value of the CPM code is less than a first reference value val_th1, the enable signal En may be deactivated. In other words, the first reference value val_th1 may determine a deactivation start time point of the enable signal En. Accordingly, the enable signal En may be deactivated at the first time point t1.

When the value of the CPM code is greater than a second reference value val_th2, the enable signal En may be activated. In other words, the second reference value val_th2 may determine a deactivation end time point of the enable signal En. Accordingly, the deactivation state of the enable signal En may be ended at the second time point t2, and may be activated. The first reference value val_th1 may be less than the second reference value val_th2.

Figure 10:
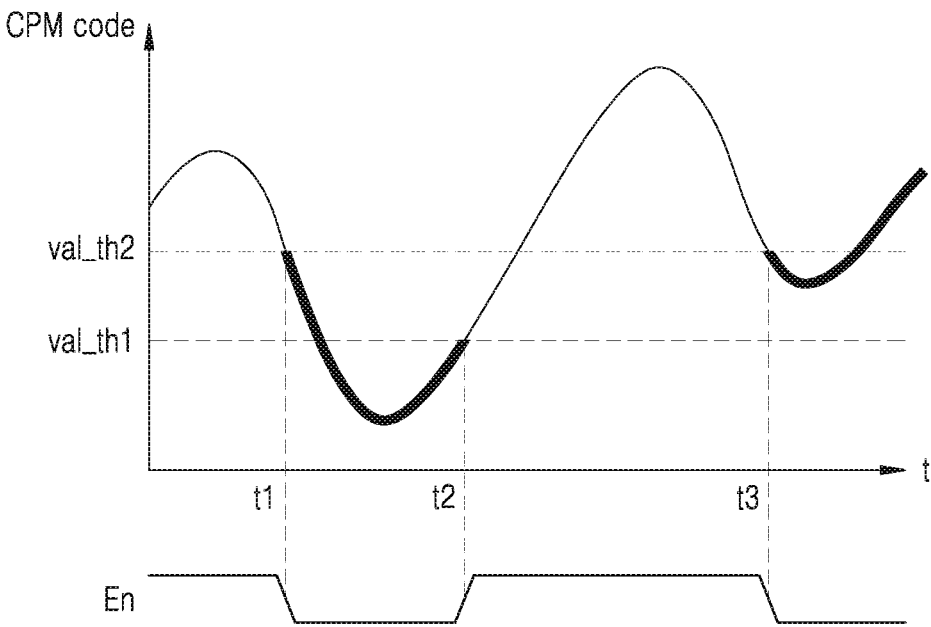
FIG. 10 is a diagram of a CPM code and reference values, according to an embodiment.

FIG. 10 is a diagram of a CPM code and reference values, according to an embodiment.

Referring to FIG. 10, when the value of the CPM code is less than the second reference value val_th2, the enable signal En may be deactivated. In other words, the second reference value val_th2 may determine the deactivation start time point of the enable signal En. Accordingly, the enable signal En may be deactivated at the first time point t1. In addition, the enable signal EN may be deactivated at the third time point t3.

When the value of the CPM code is greater than the first reference value val_th1, the enable signal En may be activated. In other words, the first reference value val_th1 may determine the deactivation end time point of the enable signal En. Accordingly, the enable signal En may be activated at the second time point t2. The first reference value val_th1 may be less than the second reference value val_th2.

Figure 11:
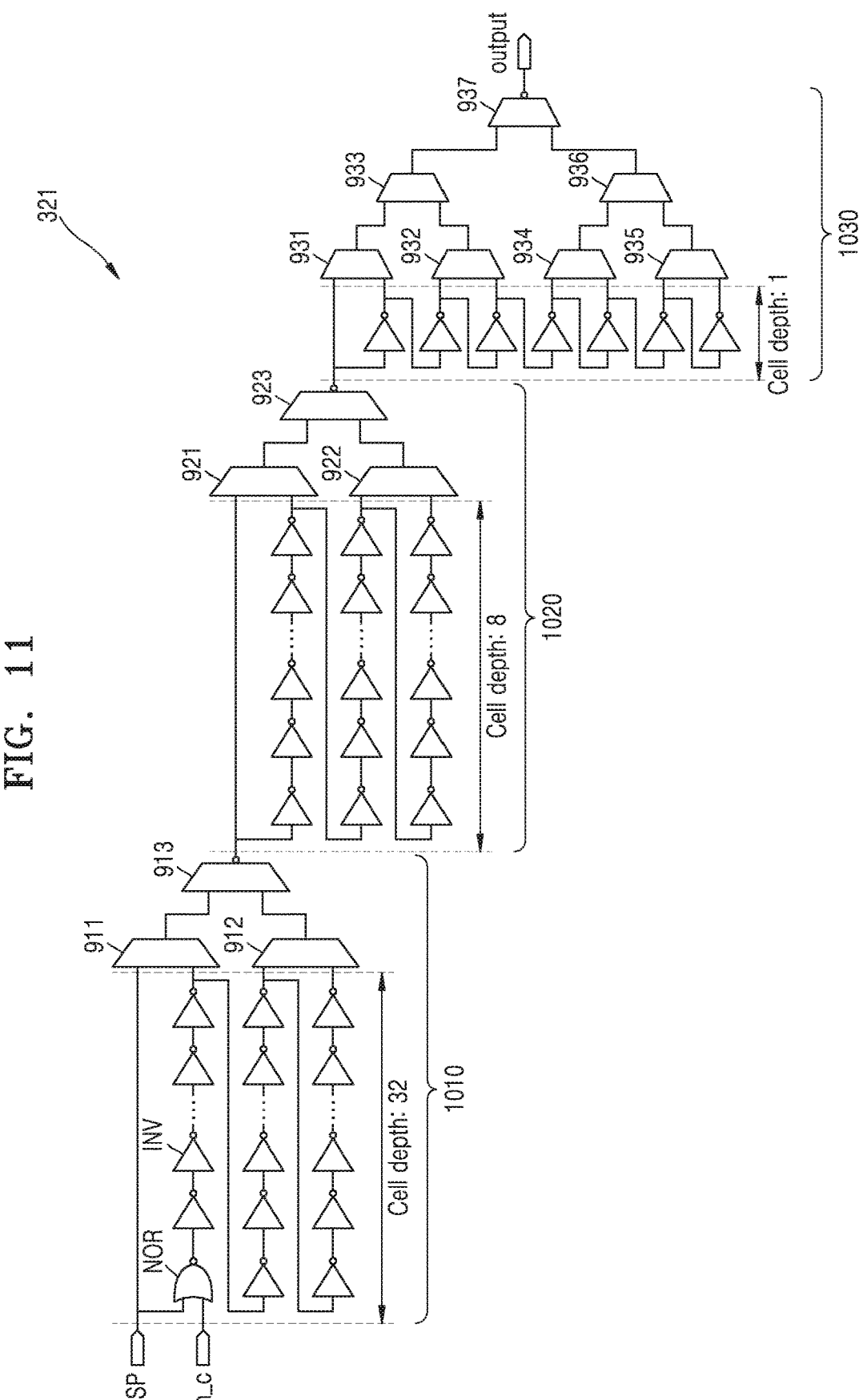
FIG. 11 is a circuit diagram of a calibration delay circuit according to an embodiment.

FIG. 11 is a circuit diagram of an example of the calibration delay circuit 321 of FIG. 4 according to an embodiment. In this example, the calibration delay circuit 321 may include first through third delay chains 1010 through 1030. The first through third delay chains 1010 through 1030 may include an inverter INV, and the delay of the sample pattern SP may be adjusted by adjusting the number of inverters INV through which the sample pattern SP passes.

The first delay chain 1010 may receive the sample pattern SP and a calibration enable signal EN_c. When the calibration enable signal EN_c is at a low level, an NOR circuit may operate as the inverter INV. The first delay chain 1010 may add a delay corresponding to 32 units of inverters INV. For example, the sample pattern SP may be provided to a selection circuit 911 without a delay, to the selection circuit 911 via 32 inverters INV, to the selection circuit 912 via 64 inverters INV, or to the selection circuit 912 via 96 inverters INV. Selection circuits 911 through 913 may output the sample pattern SP having passed via delay-free sample pattern SP, 32, 64, or 96 inverters INV.

The second delay chain 1020 may receive a signal from the first delay chain 1010, and may add a delay corresponding to eight units of inverters INV. For example, the signal received from the selection circuit 913 may be provided to a selection circuit 921 without a delay, to the selection circuit 921 via 8 inverters INV, to a selection circuit 922 via 16 inverters INV, or to the selection circuit 922 via 24 inverters INV. Selection circuits 921 through 923 may output a delay-free signal, a signal having passed through eight inverters INV, a signal having passed through 16 inverters INV, or a signal having passed through 24 inverters INV.

The third delay chain 1030 may receive a signal from the second delay chain 1020, and may add a delay corresponding to the inverter INV of one unit. For example, the signal received from the selection circuit 923 may be provided to a selection circuit 931 without a delay or via one inverter INV, to a selection circuit 932 via two or three inverters INV, to a selection circuit 934 via four or five inverters INV, or to a selection circuit 935 via six or seven inverters INV. Selection circuits 931 through 937 may output signals without a delay or signals having passed through one to seven inverters INV.

A sample pattern SP without a delay or a sample pattern SP having a delay of up to 127 inverters INV may be output by the first through third delay chains 1010 through 1030.

Circuits in the calibration delay circuit 321 may generate a delay based on the input power voltage VDDin. As a voltage drop occurs in the input power voltage VDDin, a longer delay may be generated.

Figure 12:
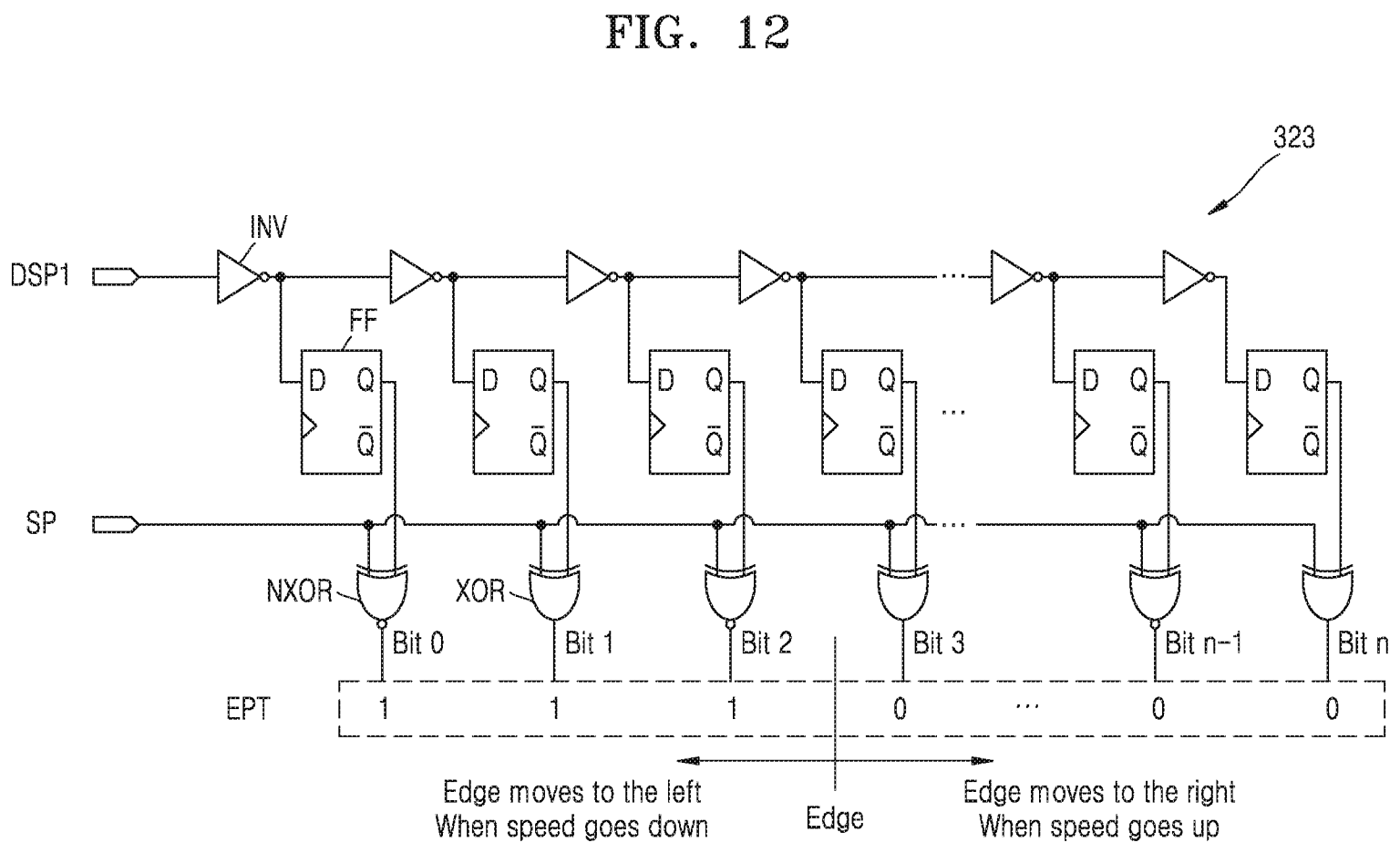

FIG. 12 is a circuit diagram of an example of the edge detector 323 in FIG. 4. In FIG. 12, the edge detector 323 in the even chain circuit 320 is illustrated, but the edge detector 333 in the odd chain circuit 330 may have the same structure.

The edge detector 323 may include a plurality of inverters INV, a plurality of flip-flops FF, a plurality of XNOR gates XNORs, and a plurality of XOR gates XORs.

The sample pattern SP may pass through the calibration delay circuit 321 and the fixed delay circuit 322 to have a delay, and the first delay sample pattern DSP1 may be generated. The first delay sample pattern DSP1 may be delayed while passing through the inverter INV in the edge detector 323. N (n is a natural number) flip-flops FF may generate the even pattern EPT by sequentially latching delayed signals, providing the latched signals to the XNOR gate or the XOR gate, and comparing the provided latched signals with the sample pattern SP. The even pattern EPT may include a number of continuous '1's, which vary according to the amount of delay. The even pattern EPT may have n bits, and bits other than the continuous '1's may include '0's. The position of the edge differentiating '1' from '0' may vary depending on the amount of delay. Referring to FIG. 12, Bit 0 through Bit 2, which are included in an even pattern EPT, may be or include '1's, and other bits may be or include '0's. An edge may exist between the second bit Bit 2 and a third bit Bit 3.

As the voltage drop of the input power voltage VDDin becomes larger, which corresponds to an increase in the circuit delay, the transmission speed of the signal may decrease, and thus, the position of an edge in the even pattern EPT may move toward the Bit 0. Conversely, as the voltage drop of the input power voltage VDDin becomes smaller, corresponding to a decrease in the circuit delay, the transmission speed of the signal may increase, and thus, the position of the edge in the even pattern EPT may move toward the Bit n.

FIG. 13 is a timing diagram describing a method of generating the CPM code.

Referring to FIG. 13, the CPM code may be generated by selectively outputting an even pattern EPT output from an even-numbered edge detector and an odd pattern OPT output from an odd-numbered edge detector. The even-numbered edge detector may include the edge detector 323, and the odd-numbered edge detector may include the edge detector 333.

Referring to FIG. 13, first through fifth edges of the sample pattern SP may be generated from first through fifth edges of the input clock signal CLK_IN. As the sample pattern SP passes through the calibration delay circuit 321 and the fixed delay circuit 322, first through fifth edges of the first delay sample pattern DSP1 may be generated.

The first delay sample pattern DSP1 may be delayed while sequentially passing through the inverter INV in the edge detector 323, and the delayed signals may be sequentially provided to the flip-flops FF. Each flip-flop FF may latch an input signal D in synchronization with the first capture clock signal capture_CLK1. The first capture clock signal CLK1 may include even-numbered cycles of the input clock signal CLK_IN.

A $(2i-1)^{th}$ flip-flop FF, a $2i^{th}$ flip-flop FF, and a $(2i+1)^{th}$ flip-flop FF in the edge detector 323 may latch the input signal D in synchronization with the second edge of the first capture clock signal capture_CLK1, and a latched signal Q may be compared with the sample pattern SP by the NXOR gate or XOR gate. Accordingly, values of a $(2i-1)^{th}$ bit, a $(2i)^{th}$ bit, and a $(2i+1)^{th}$ bit of the even pattern EPT may include 1, 0, and 0, respectively.

On the other hand, the $(2i-1)^{th}$ flip-flop FF, the $2i^{th}$ flip-flop FF, and the $(2i+1)^{th}$ flip-flop FF in the edge detector 323 may latch the input signal D in synchronization with a fourth edge of the first capture clock signal capture_CLK1, and the latched signal Q may be compared with the sample pattern SP by the NXOR gate or XOR gate. Accordingly, values of the $(2i-1)^{th}$ bit, the $(2i)^{th}$ bit, and the $(2i+1)^{th}$ bit of the even pattern EPT may be 1, 1, and 1, respectively.

In other words, the values of the $(2i-1)^{th}$ bit, the $(2i)^{th}$ bit, and the $(2i+1)^{th}$ bit of the even pattern EPT obtained at the second and fourth edges of the input clock signal CLK_IN may be {1, 0, 0} and {1, 1, 1}, respectively.

Referring to FIG. 13, first through fifth edges of the inverted sample pattern ~SP may be generated from the first through fifth edges of the input clock signal CLK_IN, respectively. As the inverted sample pattern ~SP passes through the calibration delay circuit 331 and the fixed delay circuit 332, first through fifth edges of the second delay sample pattern DSP2 may be generated.

The second delay sample pattern DSP2 may be delayed by sequentially passing through the inverter INV in the edge detector 333, and the delayed signals may be sequentially provided to the flip-flops FF. Each flip-flop FF may latch the input signal D in synchronization with a second capture clock signal capture_CLK2. The second capture clock signal capture_CLK2 may include odd-numbered cycles of the input clock signal CLK_IN.

A $(2i-1)^{th}$ flip-flop FF, a $2i^{th}$ flip-flop FF, and a $(2i+1)^{th}$ flip-flop FF in the edge detector 333 may latch the input signal D in synchronization with a third edge of the second capture clock signal capture_CLK2, and the latched signal Q may be compared with the sample pattern SP by the NXOR gate or XOR gate. Accordingly, values of the $(2i-1)^{th}$ bit, the $(2i)^{th}$ bit, and the $(2i+1)^{th}$ bit of the odd pattern OPT may be 1, 1, and 0, respectively.

On the other hand, the $(2i-1)^{th}$ flip-flop FF, the $2i^{th}$ flip-flop FF, and the $(2i+1)^{th}$ flip-flop FF in the edge detector 333 may latch the input signal D in synchronization with a fifth edge of the second capture clock signal capture_CLK2, and the latched signal Q may be compared with the sample pattern SP by the NXOR gate or XOR gate. Accordingly, values of the $(2i-1)^{th}$ bit, the $(2i)^{th}$ bit, and the $(2i+1)^{th}$ bit of the odd pattern OPT may be 1, 1, and 1, respectively.

In other words, the values of the $(2i-1)^{th}$ bit, the $(2i)^{th}$ bit, and the $(2i+1)^{th}$ bit of the odd pattern OPT obtained at the third and fifth edges of the input clock signal CLK_IN may be {1, 1, 0} and {1, 1, 1}, respectively.

The even pattern EPT and the odd pattern OPT may be selectively output to generate the CPM code. In other words, the CPM codes may be updated to {1, 0, 0}, {1, 1, 0}, {1, 1, 1}, and {1, 1, 1} respectively in response to the second through fifth cycles of the input clock signal CLK_IN.

Figure 14:
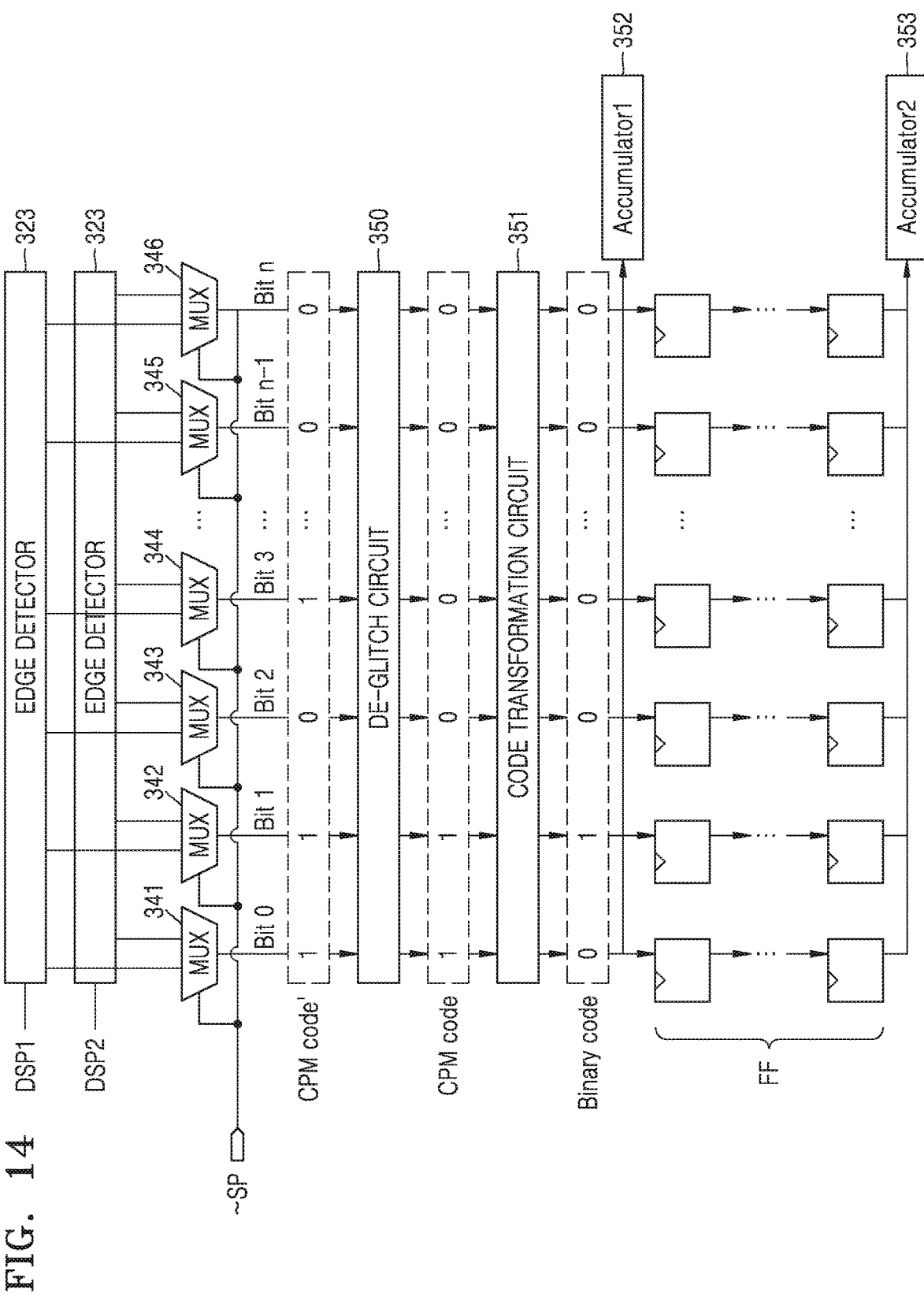
FIG. 14 is a diagram of the CPM according to an embodiment.

FIG. 14 is a diagram of the CPM according to an embodiment.

Referring to FIG. 14, the edge detector 323 may output the even pattern EPT based on the first delay sample pattern DSP1, and the edge detector 333 may output the odd pattern OPT based on the second delay sample pattern DSP2.

Referring to FIGS. 13 and 14, selection circuits 341 through 346 may generate CPM code' before correction, by selectively outputting the even pattern EPT or the odd pattern OPT based on the inverted sample pattern ~SP. In other words, when the inverted sample pattern ~SP is at a high level, the even pattern EPT may be output, and when the inverted sample pattern ~SP is at a low level, the odd pattern OPT may be output. The selection circuits 341 through 346 may correspond to the selection circuit 340 in FIG. 4.

Due to various causes, a glitch or an error may occur in CPM code' before correction. For example, a third bit of CPM code' before correction should include 0, but may include 1 due to an error. The de-glitch circuit 350 may generate CPM code' by removing the glitch from CPM code' before correction.

A code conversion circuit 351 may generate a binary code based on the CPM code. The binary code may mean a binary value corresponding to the CPM code.

A first accumulator 352 may generate a current having a magnitude proportional to the binary value, and as the magnitude of the generated current is compared with the reference value val_th, whether the enable signal En is to be deactivated may be determined.

As illustrated in FIG. 13, the value of the CPM code may be updated at every cycle of the input clock signal CLK_IN. The CPM code may be converted into a binary code and sequentially recorded in the flip-flop FF at every cycle of the input clock signal CLK_IN. In other words, a second accumulator 353 may generate a current having a magnitude proportional to a binary value corresponding to the CPM code before being updated.

While the inventive concept has been particularly shown and described with reference to embodiments thereof, it will be understood that various changes in form and details may be made therein without departing from the spirit and scope of the following claims.

What is claimed is:

1. A semiconductor device comprising:
an intellectual property (IP) block configured to operate based on a first clock signal and a power voltage;
a clock gating circuit configured to generate the first clock signal by selectively performing clock gating on a second clock signal based on an enable signal; and
a critical path monitor (CPM) configured to operate based on the power voltage and generate a digital code having a value, which varies according to a voltage drop of the power voltage, and to activate the enable signal based on a comparison of the value of the digital code with a reference value.

2. The semiconductor device of claim 1, wherein a value of the digital code decreases as the voltage drop increases.

3. The semiconductor device of claim 1,
wherein the CPM comprises:
a waveform generator configured to generate a periodic waveform having a frequency that is less than a frequency of the first clock signal, and to generate and output a first sample waveform and a second sample waveform having an inverted level of the first sample waveform by sampling the periodic waveform at first edges of the first clock signal;
a first waveform generation circuit configured to generate a first waveform by delaying the first sample waveform;
a second waveform generation circuit configured to generate a second waveform by delaying the second sample waveform; and
a comparator configured to generate the enable signal based on the value of the digital code, in which the first waveform is merged with the second waveform, and the reference value.

4. The semiconductor device of claim 3,
wherein the first waveform generation circuit comprises:
a first delay circuit configured to generate a first delay sample waveform by adjusting a delay of the first sample waveform; and
a first edge detector configured to generate the first waveform based on a comparison result between the first delay sample waveform and the first sample waveform,
wherein the second waveform generation circuit comprises:
a second delay circuit configured to generate a second delay sample waveform by adjusting a delay of the second sample waveform; and
a second edge detector configured to generate the second waveform based on a comparison result between the second delay sample waveform and the second sample waveform.

5. The semiconductor device of claim 4, wherein the CPM further comprises a selection circuit configured to generate the digital code by selectively outputting the first waveform or the second waveform based on the second sample waveform.

6. The semiconductor device of claim 1,
wherein the CPM is configured to:
deactivate the enable signal if a value of the digital code is equal to or less than a first reference value, and activate the enable signal if the value of the digital code is greater than a second reference value, wherein the second reference value is different from the first reference value.

7. The semiconductor device of claim 1, wherein the CPM is configured to deactivate the enable signal during a reference time if the value of the digital code is equal to or less than a reference value.

8. The semiconductor device of claim 1, wherein the CPM is configured to update the value of the digital code at each cycle of the second clock signal.

9. An operating method of a semiconductor device, the operating method comprising:

generating a first sample waveform and a second sample waveform having an inverted phase with respect to the first sample waveform by sampling an input waveform based on a first clock signal;

generating a first waveform based on a comparison result between the first sample waveform and a first delay waveform generated by delaying the first sample waveform using a first delay circuit operating based on a power voltage;

generating a second waveform based on a comparison result between the second sample waveform and a second delay waveform generated by delaying the second sample waveform using a second delay circuit operating based on the power voltage;

generating an enable signal by comparing a value of a digital code, in which the first waveform is merged with the second waveform, with a reference value; and performing a clock gating on the first clock signal based on the enable signal.

10. The operating method of claim 9, wherein the value of the digital code decreases as a voltage drop of the power voltage increases.

11. The operating method of claim 9, wherein the generating of the enable signal comprises, generating the digital code by selectively outputting the first waveform and the sample waveform based on the second sample waveform.

12. The operating method of claim 9, wherein the generating of the enable signal comprises:

deactivating the enable signal in response to the value of the digital code being equal to or less than a first reference value; and activating the enable signal in response to the value of the digital code being greater than a second reference value, wherein the second reference value is different from the first reference value.

13. The operating method of claim 9, wherein the generating of the enable signal comprises deactivating the enable signal during a reference time when the value of the digital code is equal to or less than the reference value.

14. The operating method of claim 9, wherein the generating of the enable signal comprises updating the value of the digital code at each cycle of the first clock signal.

15. The operating method of claim 9, wherein a cycle of the input waveform is at least twice a cycle of the first clock signal.

16. A semiconductor device comprising:

a processor;

a clock generator configured to generate a first clock signal;

a clock gating circuit configured to generate a second clock signal provided to the processor by performing a clock gating on the first clock signal based on an enable signal; and a critical path monitor (CPM) configured to operate based on a power voltage, and adjust a deactivation time of the enable signal based on a magnitude of the power voltage, wherein the processor is configured to operated based on the first clock signal and the power voltage.

17. The semiconductor device of claim 16, wherein the CPM increases the deactivation time of the enable signal as the power voltage decreases.

18. The semiconductor device of claim 16, wherein the CPM generates a digital code representing a circuit delay due to a voltage drop of the power voltage, and deactivates the enable signal by comparing a value of the digital code with a reference value.

19. The semiconductor device of claim 18, wherein the value of the digital code decreases as the power voltage decreases.

20. The semiconductor device of claim 18, wherein the CPM comprises:

a calibration delay circuit configured to adjust a delay of a sample waveform;

a waveform generator configured to output a first sample waveform and a second sample waveform having an inverted level of the first sample waveform based on the first clock signal;

a first waveform generation circuit configured to generate a first waveform by delaying the first sample waveform;

a second waveform generation circuit configured to generate a second waveform by delaying the second sample waveform; and a comparator configured to generate the enable signal based on the value of the digital code, in which the first waveform is merged with the second waveform, and the reference value.

* * * * *